US008804372B2

(12) United States Patent
Faulkner et al.

(10) Patent No.: US 8,804,372 B2
(45) Date of Patent: Aug. 12, 2014

(54) ELECTRICAL DISCONNECT APPARATUS

(75) Inventors: Mark Andre Faulkner, Greenwood, SC (US); Jerry Sluder Wang, Arden, NC (US); Richard Lyle Hotchkiss, Greenwood, SC (US)

(73) Assignee: Eaton Corporation, Cleveland, OH (US)

( * ) Notice: Subject to any disclaimer, the term of this patent is extended or adjusted under 35 U.S.C. 154(b) by 163 days.

(21) Appl. No.: 13/427,005

(22) Filed: Mar. 22, 2012

(65) Prior Publication Data

US 2013/0250539 A1 Sep. 26, 2013

(51) Int. Cl.
*H05K 7/02* (2006.01)
*H05K 7/04* (2006.01)
*H01H 9/20* (2006.01)

(52) U.S. Cl.
USPC ........................................ 361/807; 200/50.05

(58) Field of Classification Search
None
See application file for complete search history.

(56) References Cited

U.S. PATENT DOCUMENTS 4,145,585 A * 3/1979 Iwasaki .................... 200/11 DA
4,200,773 A * 4/1980 Komatsu et al. ............ 200/11 R
4,691,180 A 9/1987 Grunert et al.
5,111,009 A * 5/1992 Chan et al. .................... 200/330
5,288,958 A * 2/1994 Grunert et al. ................ 200/331
5,821,487 A * 10/1998 Groves et al. .............. 200/50.02
5,902,973 A * 5/1999 Ramey et al. .............. 200/50.01
6,028,273 A * 2/2000 Osborn, Jr. ................. 200/51.09
6,124,558 A * 9/2000 Baumeister et al. .......... 200/501
6,194,983 B1 * 2/2001 Bogdon et al. .................. 335/68
6,222,143 B1 * 4/2001 Lawson et al. ................ 200/401
6,423,912 B1 * 7/2002 Arenz et al. ............... 200/43.08
6,518,526 B2 * 2/2003 Hamada et al. ............... 200/330
6,576,851 B1 * 6/2003 Barlian et al. ................ 200/5 R
6,606,229 B2 * 8/2003 Takahashi et al. ............ 361/115
6,797,903 B1 * 9/2004 Winslett et al. ............... 200/331
6,989,499 B2 * 1/2006 Bortolloni et al. ......... 200/50.05
7,214,895 B2 * 5/2007 Houck et al. .................. 200/310
7,238,903 B2 * 7/2007 Fischer ......................... 200/330
7,368,675 B2 * 5/2008 Ishido et al. .................. 200/331
7,462,792 B1 * 12/2008 Hellmers et al. ........... 200/50.33
7,544,907 B1 6/2009 Moffat et al.
8,068,320 B2 11/2011 Faulkner et al.
8,089,252 B2 * 1/2012 Lu .................................. 322/25
8,115,127 B2 * 2/2012 Nguyen et al. ................ 200/330
8,168,900 B2 * 5/2012 Haendler et al. ........... 200/43.05
2002/0079201 A1 * 6/2002 Yang .......................... 200/50.26
2004/0099515 A1 * 5/2004 Houck, III ................. 200/50.07
2006/0000697 A1 * 1/2006 Houck et al. .................. 200/316
2008/0258667 A1 * 10/2008 Morris et al. ................. 318/490

* cited by examiner

*Primary Examiner* — Hoa C Nguyen
*Assistant Examiner* — Xanthia C Cunningham
(74) *Attorney, Agent, or Firm* — Eckert Seamans Cherin & Mellott, LLC; Brij K. Agarwal

(57) ABSTRACT

An improved electrical disconnect apparatus includes a set of spaced apart conductors and a removable conductive element that is structured to extend between the conductors and to complete at least a portion of an electrical circuit that includes the conductors. The electrical disconnect apparatus is situated between an electrical network and a network protector. The conductors and the conductive element which extends therebetween are situated within the interior of a support that is sealed in order to permit the electrical disconnect apparatus to be in a submerged environment during use. The conductive element is retained by a key interlock wherein the key that enables removal of the conductive element is stored on the network protector and is only made available to the technician when the network protector has been switched to an OFF condition.

14 Claims, 7 Drawing Sheets

ELECTRICAL DISCONNECT APPARATUS

BACKGROUND OF THE INVENTION

1. Field of the Invention

The present invention relates generally to power distribution equipment and, more particularly, to an electrical disconnect apparatus for use in an AC secondary network system.

2. Description of the Related Art

Two primary objectives of the electric utility industry in the delivery of electrical power are safety and reliability. Since the late 1920s, AC secondary network systems have been used in certain locations such as downtown business districts and commercial areas in order to provide a high degree of service continuity. In such an AC secondary network system, a plurality of secondary mains surround the area being served, such as a city block, and are connected with a set of bus bars to form a secondary network grid at low voltage to which the customer loads are connected.

Electrical power is supplied to the secondary network by a plurality of medium voltage distribution lines. Each medium voltage distribution line delivers power to the network through network transformers. The transformers reduce the medium voltage from the distribution lines to a lower voltage suitable for distribution to the customers.

In such secondary network systems, a failure of any one distribution line will not result in an interruption of service to the customers since electrical power will be supplied to the customers over the remaining distribution lines. When a failure or fault occurs in a medium voltage distribution line or in one of its associated network transformers, the station end of the distribution line, that is, the end of the distribution line closest to the generating station, is disconnected from the system by opening a feeder circuit breaker. In addition, it is necessary that all of the network transformers on the failed distribution line be disconnected from the secondary network by some type of protective device to prevent power from the secondary network from being fed back through the network transformers to the fault. The protective device that has been used for such purpose is the network protector.

The network protector consists of a specially designed circuit breaker with a closing and opening mechanism that is controlled by a relay. When the network protector is closed, the relay operates to trip the network protector upon a reversal of power flow. The relay acts to close the network protector when, an only when, the proper voltage conditions exist across the network protector.

Network protectors typically have been located outdoors either above ground or below ground and thus have been protected by a sealed enclosure. When a network protector is approached for maintenance, testing, or repair, the network protector must be electrically and physically disconnected from the power distribution equipment on both the network transformer side and the secondary network side. Historically, this consideration dictated the use of a rollout-type or draw-out-type circuit breaker which could be disconnected and rolled out of its enclosure for maintenance, testing, and repair.

However, such a rollout-type or draw-out-type circuit breaker will typically still be energized in some fashion by the attached network, which results in a certain level of potential danger to a technician. It thus would be desirable to alleviate the dangers to technicians and others.

SUMMARY OF THE INVENTION

An improved electrical disconnect apparatus includes a set of spaced apart conductors and a removable conductive element that is structured to extend between the conductors and to complete at least a portion of an electrical circuit that includes the conductors. The conductive element is removable by a technician to open the aforementioned circuit. The electrical disconnect apparatus is advantageously situated between an electrical network and a network protector and advantageously electrically disconnects the network protector from the network when the conductive element is removed. The conductors and the conductive element which extends therebetween are situated within the interior of a support that is sealed in order to permit the electrical disconnect apparatus to be in a submerged environment during use. The conductive element is retained by a key interlock wherein the key that enables removal of the conductive element is stored on the network protector and is only made available to the technician when the network protector has been switched to an OFF condition. In such a situation, the technician can remove the key from the network protector and insert it into the key interlock of the electrical disconnect apparatus to enable removal of the conductive element, and such removal electrically isolates the network protector from the network.

Accordingly, an aspect of the disclosed and claimed concept is to provide an improved electrical disconnect apparatus that enables a network protector to be electrically isolated from an electrical network.

Another aspect of the disclosed and claimed concept is to provide such an electrical disconnect apparatus that is suited to conditions where it may be submerged under water during operation.

These and other aspects of the disclosed and claimed concept are provided by an improved electrical disconnect apparatus, the general nature of which can be stated as including a support, a first electrical conductor situated on the support, a second electrical conductor situated on the support, and a connection device that includes a conductive element. The connection device is structured to be movable between a first position wherein the conductive element is electrically connected with each of the first and second electrical conductors and completes at least a portion of a circuit that includes the first and second electrical conductors, and a second position wherein the conductive element is removed from electrical contact with each of the first and second electrical conductors.

BRIEF DESCRIPTION OF THE DRAWINGS

A further understanding of the disclosed and claimed concept can be gained from the following Description of the Preferred Embodiment when read in conjunction with the accompanying drawings in which:

Similar numerals refer to similar parts throughout the specification.

DESCRIPTION OF THE PREFERRED EMBODIMENTS

An improved disconnect apparatus 4 in accordance with the disclosed and claimed invention is depicted generally in FIGS. 1-2 and 7A-7B, and is depicted in part in FIGS. 2A-6B. As can be understood from FIGS. 1-2, the disconnect apparatus 4 can be said to include a conduction system 6 and a connection device 10 that are cooperable with one another. More particularly, when the conduction system 6 and the connection device 10 are cooperated with one another and are in a secured configuration, as is depicted generally in FIGS. 1 and 7B, the disconnect apparatus 4 completes at least a portion of a circuit that includes electrical connections with a network protector and an electrical network that are not expressly depicted herein. When the connection device 10 is removed from the conduction system 6, as is depicted generally in FIG. 5, the aforementioned portion of the circuit is in an OPEN condition, when enables the aforementioned network protector to be electrically isolated from the electrical network.

Figure 1:
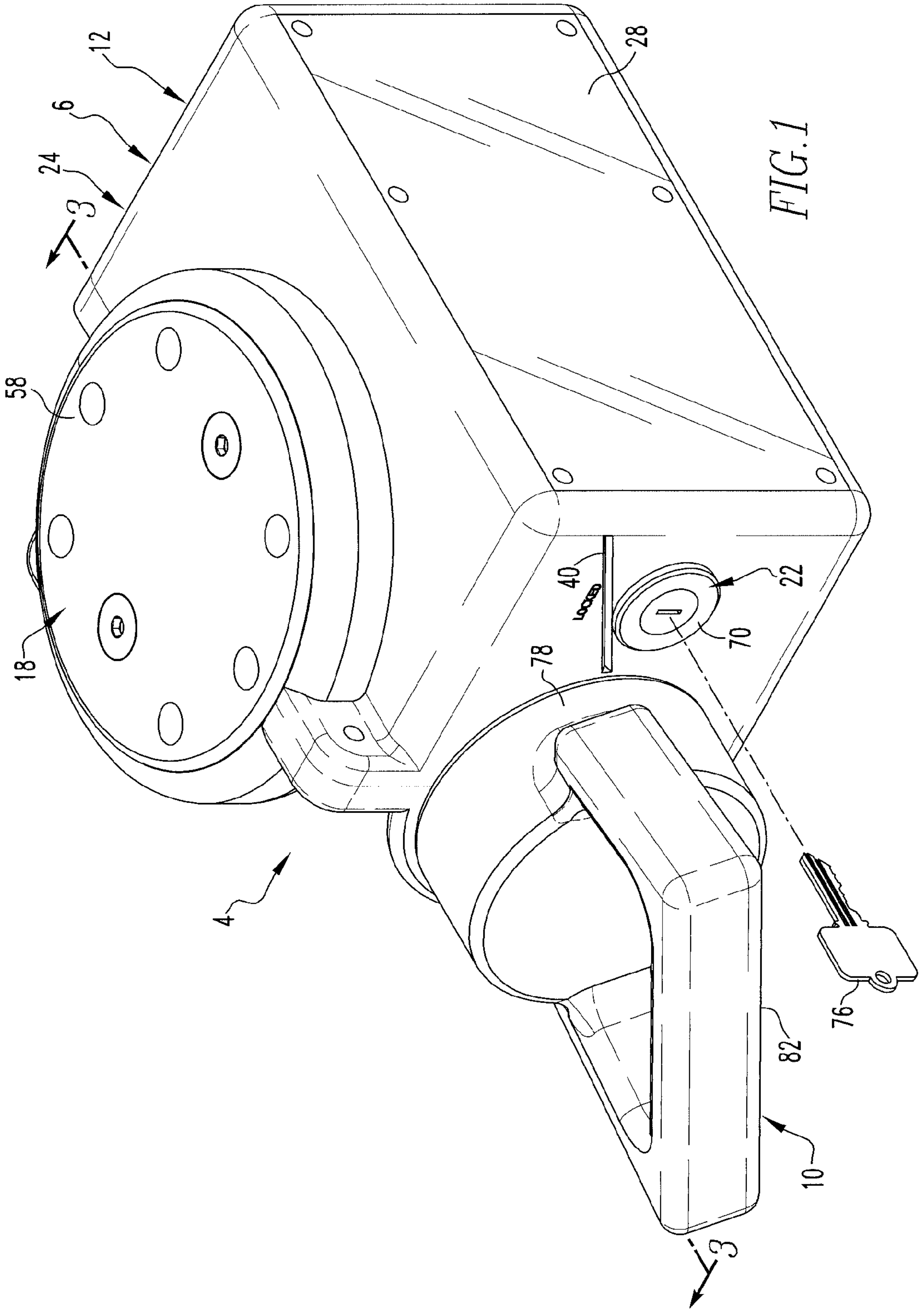
FIG. 1 is a perspective view of an improved disconnect apparatus in accordance with the invention.
Figure 2:
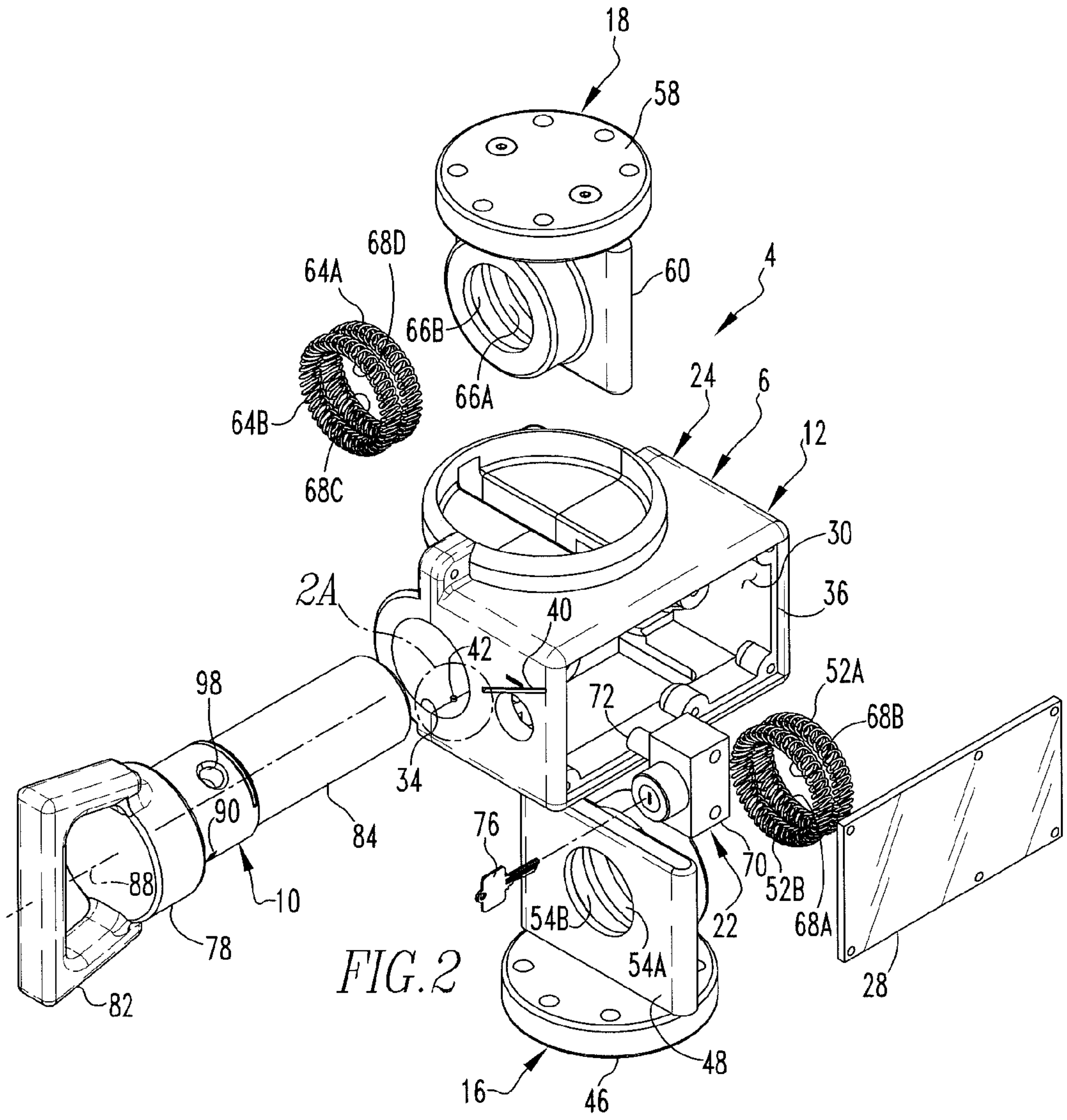
FIG. 2 is an exploded perspective view of the disconnect apparatus of FIG. 1.
Figure 2A:
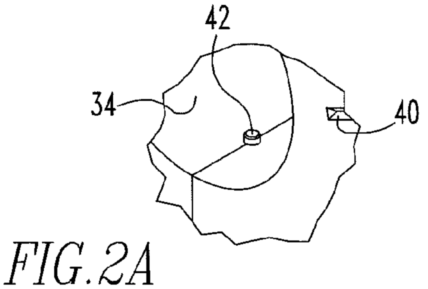
FIG. 2A is an enlarged view of the indicated portion of FIG. 2.

As can be understood from FIG. 2, the conduction system 6 can be said to include a support 12 upon which are disposed a first conductor assembly 16 and a second conductor assembly 18. The first conductor assembly 16 is electrically connectable with an electrical network, and the second conductor assembly 18 is electrically connectable with a network protector. As will be set forth in greater detail below, when the connection device 10 is in the secured configuration of FIGS. 1 and 7B, a portion of the connection device 10 electrically extends between the first and second conductor assemblies 16 and 18 to electrically connect them together and to close at least a portion of a circuit that includes them.

Figure 6A:
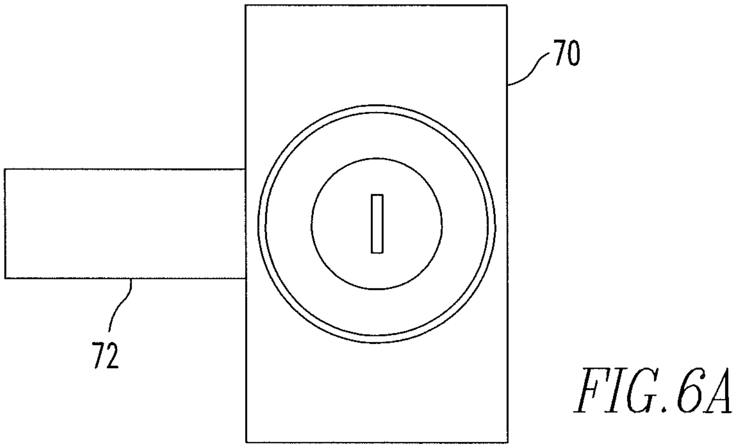
FIG. 6A is a front elevational view of a lock apparatus of the conduction system in a locked position.
Figure 6B:
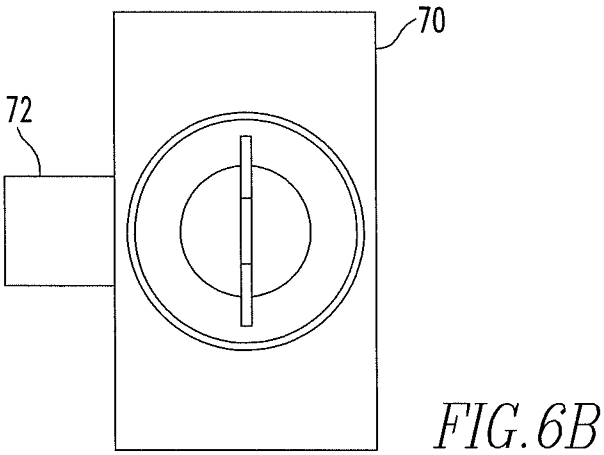
FIG. 6B is a view similar to FIG. 6A, except depicting the lock apparatus in an unlocked position.

The conduction system 6 further includes a lock apparatus 22 disposed on the support 12 and that is movable between a locked position, as is depicted generally in FIG. 6A, and an unlocked position, as is indicated generally in FIG. 6B. As will be set forth in greater detail below, the lock apparatus 22 is cooperable with the connection device 10 to retain the connection device 10 in a secured configuration.

As can further be understood from FIGS. 1 and 2, the support 12 can be said to include a main portion 24 and a window 28. The main portion 24 is formed of a plastic material and, in the depicted exemplary embodiment, is formed of a thermosetting epoxy resin such as a cycloaliphatic material, although other materials may be employed depending upon the needs of the particular application. The window 28 is a flat plate of plastic material, such as a thermosetting epoxy resin or other material, that is translucent, meaning that it permits the complete or partial transmission of visible light therethrough.

While FIG. 2 depicts the conduction system 6 in an exploded configuration, it is noted that the main portion 24 is actually molded in situ about the first and second conductor assemblies 16 and 18 and the lock apparatus 22. That is, the first and second conductor assemblies 16 and 18 and the lock apparatus 22 are placed in a mold apparatus that is not expressly depicted herein. The uncured material out of which the main portion 24 is formed is then poured into the mold apparatus and permitted to cure in contact with the first and second conductor assemblies 16 and 18 and the lock apparatus 22. The result of such a formation operation results in the main portion 24 having a fluid-tight relationship with the first and second conductor assemblies 16 and 18 and the lock apparatus 22 within the range of pressures that the disconnect apparatus 4 is intended to experience. That is, the disconnect apparatus 4 is intended to be operable within an environment submerged within a quantity of water, and the main portion 24 forms a watertight seal with the first and second conductor assemblies 16 and 18 and the lock apparatus 22 within the range of water pressures that the disconnect apparatus 4 is intended to experience. It is noted, however, that other formation methodologies may be employed without departing from the present concept.

As can further be understood from FIG. 2, the main portion 24 is formed with a hollow interior region 30 and a substantially cylindrical opening 34 that is in communication with the interior region 30. In the depicted exemplary embodiment, the main portion 24 is formed with a seat 36 along one side thereof that is structured to receive the window 28, although the seat 36 is optional depending upon the method of attaching the window 28 to the main portion 24. The window 28 is attachable to the main portion 24 with rivets, screws, or other attachment devices that are received in holes formed about the perimeter of the window 28 in order to provide a fluid-tight seal between the window 28 and the main portion 24. The main portion 24 further has an indicator 40 formed thereon that will be described in greater detail below.

Figure 3:
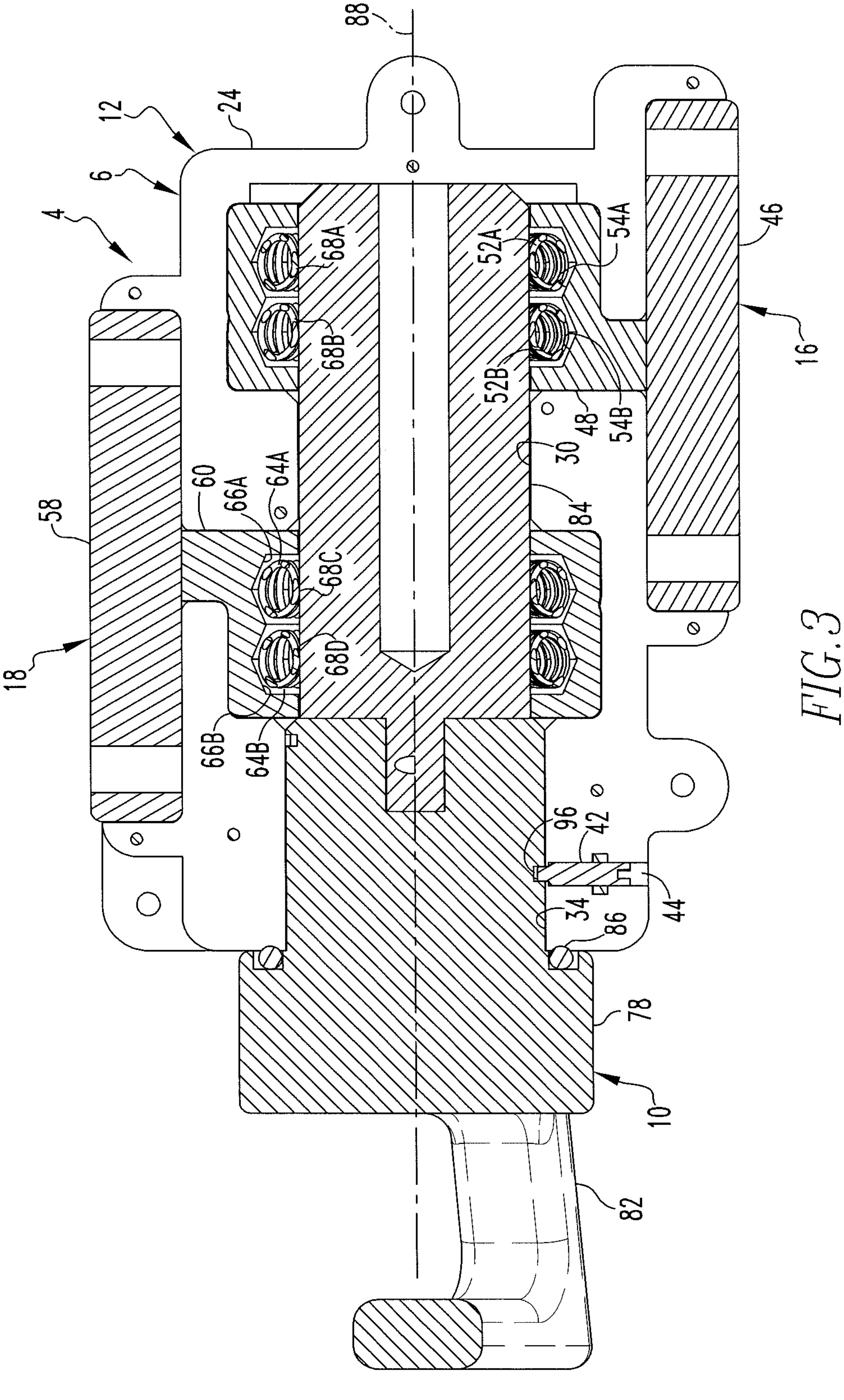
FIG. 3 is a sectional view as taken along line 3-3 of FIG. 1.
Figure 4:
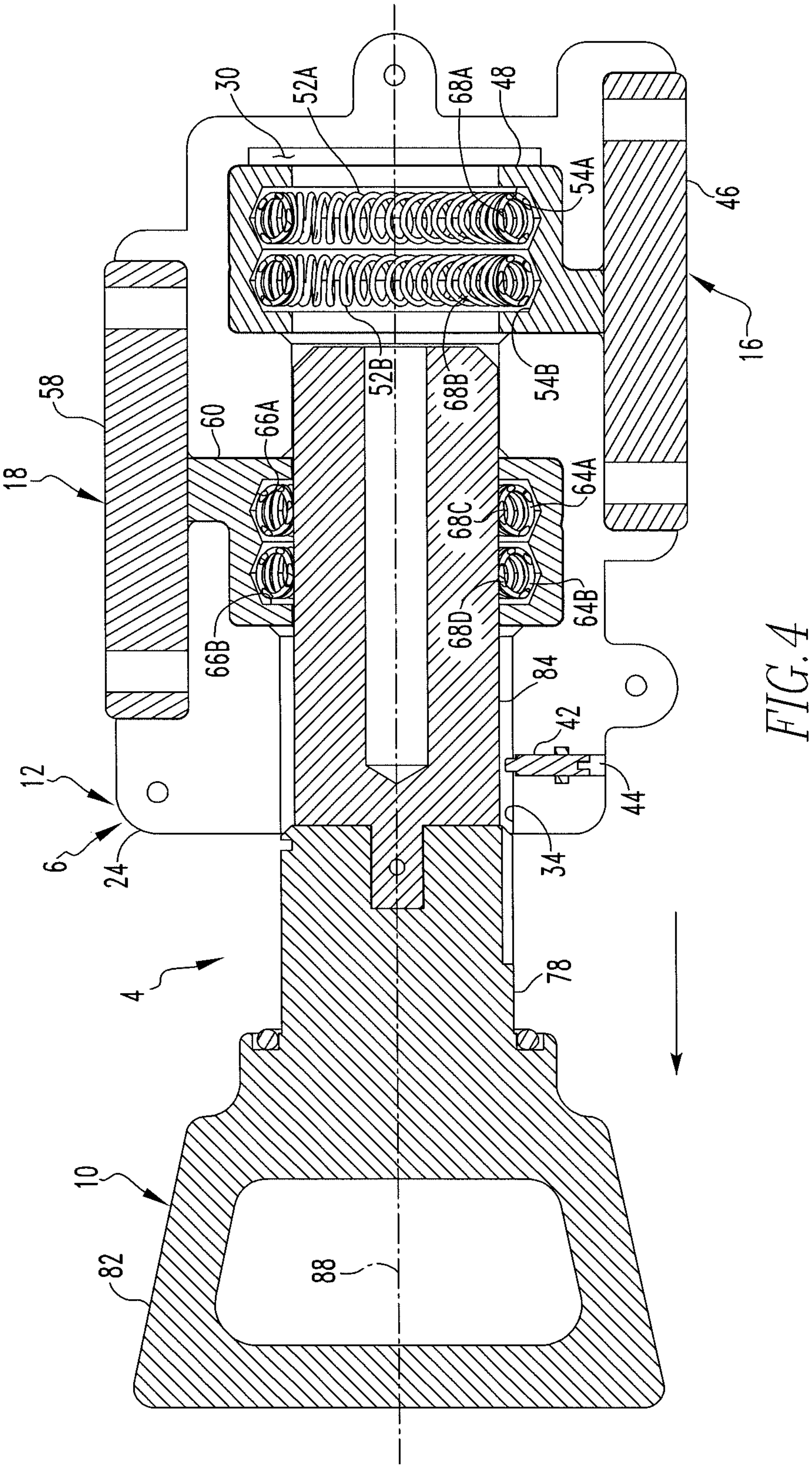
FIG. 4 is a view similar to FIG. 3, except depicting a connection device of the disconnect apparatus partially removed from a conduction system of the disconnect apparatus.

As can further be understood from FIGS. 2-4, and the conduction system 6 has a pin 42 that is situated on the main portion 24 and that protrudes from the surface of the opening 34. The pin 42 serves as a longitudinal engagement element that protrudes into the opening 34 and that is cooperable with the connection 10 in a fashion that will be set forth in greater detail below. In the exemplary embodiment depicted herein, the pin 42 is received in an access port 44 and is retained therein in a fluid-tight fashion. The pin 42 may be formed of a metallic material, but nonmetallic materials may also be employed. In alternative embodiments, the pin potentially could be formed as a part of the main portion 24 during the aforementioned molding operation, or it can be held in place on the mold apparatus to permit the material from which the main portion 24 is molded to be molded in situ about the pin 42. Other formation methodologies can be employed without departing from the present concept.

Further regarding FIG. 2, it can be seen that the first conductor assembly 16 includes a first conductor plate 46, a first conductor brace 48, and a pair of first flexible conductors 52A and 52B. The first conductor brace 48 has a pair of annular seats 54A and 54B formed thereon that are structured to receive the first flexible conductors 52A and 52B therein. Likewise, the second conductor assembly 18 includes a second conductor plate 58, a second conductor brace 60, and a pair of second flexible conductors 64A and 64B. The second conductor brace 60 has a pair of annular seats 66A and 66B formed thereon that are structured to receive therein the second flexible conductors 64A and 64B. The first and second conductor assemblies 16 and 18 are substantially identical to one other but are situated at different positions on the support 12. Moreover, as suggested above, the first conductor assembly 16 is electrically connectable with an electrical network, and the second conductor assembly 18 is electrically connectable with a network protector.

In the first conductor assembly 16, the first conductor plate 46 and the first conductor brace 48 are co-formed as a single piece unit out of a conductive material such as copper. The second conductor plate 58 and the second conductor brace 60 are likewise co-formed as a single piece unit out of a conductive material such as copper. In the depicted exemplary embodiment, such co-forming occurs via casting, although other formation methodologies can be employed without departing from the present concept.

The first and second flexible conductors 52A, 52B, 64A, and 64B are in the exemplary form of conductive springs that are wound in a roughly helical configuration and that are in the shape of a toroid. The first and second flexible conductors 52A, 52B, 64A, and 64B are formed of a material that is electrically compatible with the first and second conductor braces 48 and 60. The first and second flexible conductors 52A, 52B, 64A, and 64B thus each have a circular receptacle 68A, 68B, 68C, and 68D that is structured to receive therein a portion of the connection device 10. When the connection device 10 is received in the receptacles 68A, 68B, 68C, and 68D and is electrically connected with the first and second flexible conductors 52A, 52B, 64A, and 64B, the first and second flexible conductors 52A, 52B, 64A, and 64B will be situated radially about the connection device 10.

As will be discussed below in conjunction with FIGS. 3 and 4, the first and second flexible conductors 52A, 52B, 64A, and 64B are electrically connectable with the connection device 10 in the secured configuration. While the first and second conductor assemblies 16 and 18 are each depicted as including a pair of the flexible conductors, i.e., the first flexible conductors 52A and 52B and the second flexible connectors 64A and 64B, it is understood that in other embodiments the first and second conductor assemblies potentially may each include only a single flexible conductor, depending upon the needs of the particular application.

As can be understood from FIGS. 2, 6A, and 6B, the lock apparatus 22 includes a lock housing 70, a locking element 72, and a key 76. The key 76 is cooperable with the lock housing 70 to move the locking element 72 between a locked position, as is depicted generally in FIGS. 2 and 6A, and an unlocked position, as is depicted generally in FIG. 6B. The lock apparatus 22 can be any of a wide variety of locking devices and, in the depicted exemplary embodiment, is manufactured by the Kirk Key Interlock Company of Massillon, Ohio, USA, although other key interlocks may be employed without departing from the present concept. In the depicted exemplary embodiment, the key 76 can only be inserted into the key slot of the lock housing 70 or removed therefrom when the locking element 72 is in the locked position depicted generally in FIG. 6A.

Figure 5:
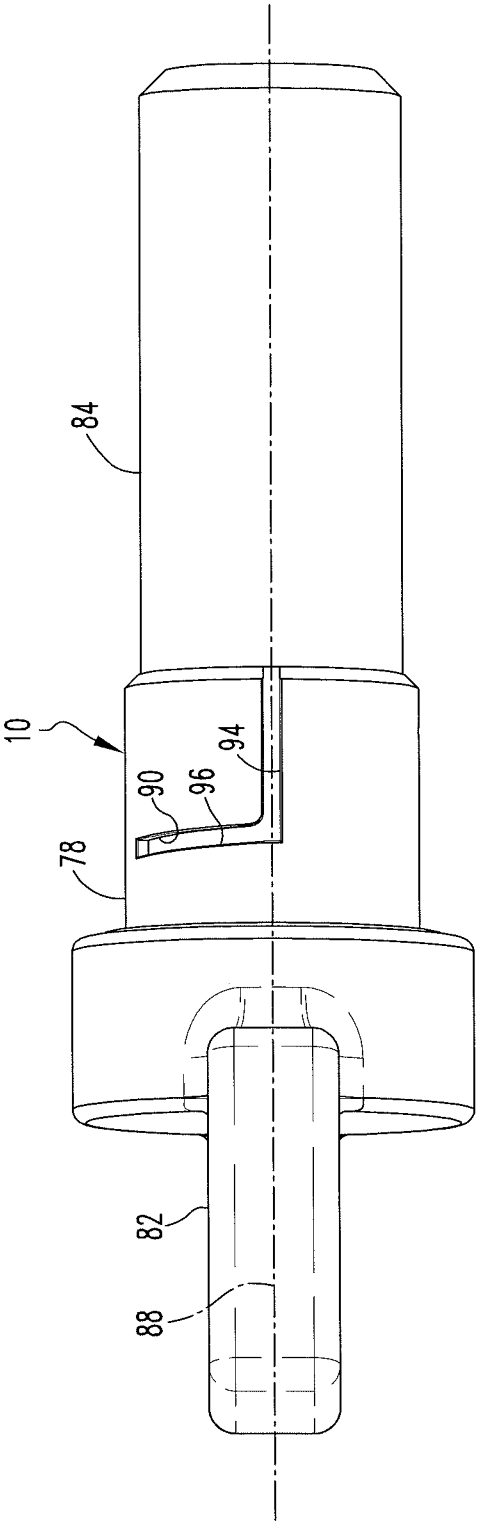
FIG. 5 is a front elevational view of the connection device removed from the conduction system.

As can be understood from FIGS. 2 and 5, the connection device 10 can be said to include a base 78, a handle 82, and a conductive element 84. As can be understood from FIGS. 3 and 4, the connection device 10 further includes a seal 86 in the exemplary form of an O-ring that is received in an annular seat formed on the base 78. The base 78 and the handle 82 are, in the exemplary embodiment depicted generally herein, co-formed as a single piece unit from a nonconductive material such as the cycloaliphatic epoxy material mentioned elsewhere herein, although other materials may be employed without departing from the present concept. The conductive element 84 has a cylindrical outer surface and is formed of a conductive material such as copper that is electrically compatible with the first and second flexible conductors 52A, 52B, 64A, and 64B. The conductive element 84 can be connected with the base 78 in any of a variety of fashions, such as by adhering them together, by forming cooperable threads on each, or by molding the base 78 and the handle 82 in situ with the conductive element 84, although other formation methodologies may be employed without departing from the present concept.

As can be best understood from FIGS. 3 and 4, the base 78 and the conductive element 84 together form an elongated shank, and the connection device 10 is translatable along an axis of elongation 88 of the shank to enable the conductive element 84 and a portion of the base 78 to be received in the opening 34 of the main portion 24 and in the receptacles 68A-D of the first and second flexible conductors 52A, 52B, 64A, and 64B. As can be understood from FIG. 5, the base 78 has an L-shaped slot 90 formed thereon that can be said to include an advancement portion 94 that is oriented substantially parallel with the axis of elongation 88 and a locking portion 96 that extends circumferentially about the axis of elongation 88. The slot 90 is structured to receive the pin 42 therein, as can be seen in FIG. 3 which depicts the pin 42 being received in the locking portion 96 of the slot 90. As can be seen in FIG. 2, the base 78 further has a hole 98 formed therein, and the hole 98 is structured to receive the locking element 72 therein in the secured configuration of the disconnect apparatus 4.

In use, and as suggested above, the first conductor assembly 16 is electrically connected with an electrical network, and the second conductor assembly 18 is electrically connected with a network protector. The support 12 typically will be affixed to an outer structure of the network protector, although other mounting methodologies may be employed without departing from the present concept.

Figure 7A:
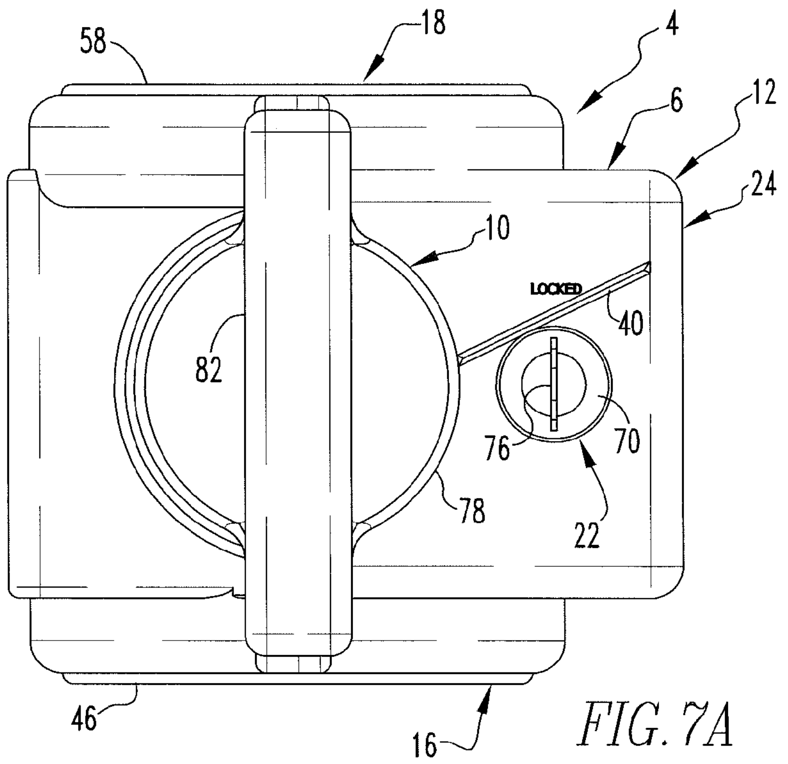
FIG. 7A is an end elevational view of the disconnect apparatus with the connection device pivoted away from a secured configuration of the disconnect apparatus.
Figure 7B:
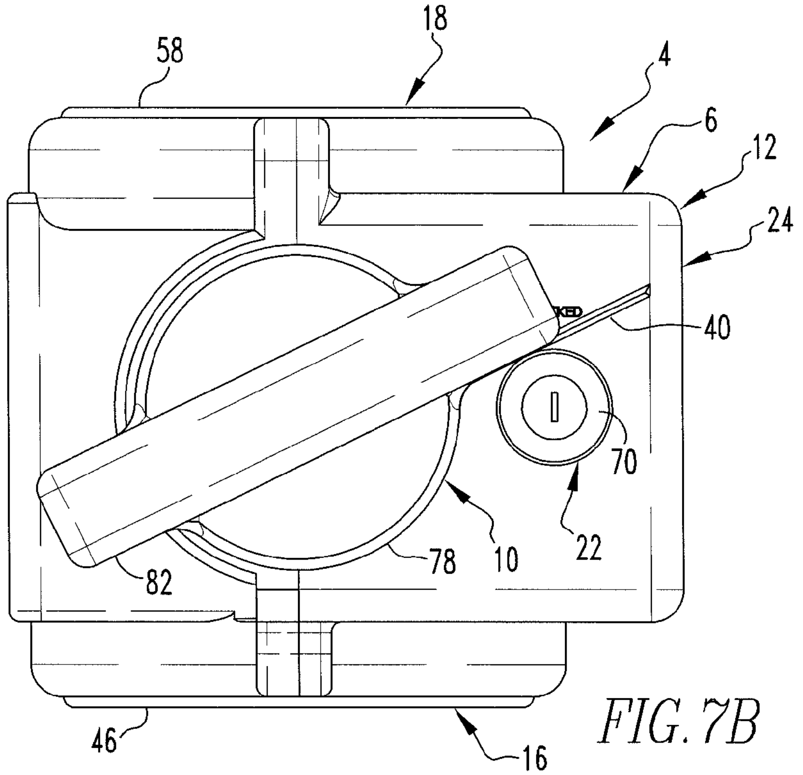
FIG. 7B is a view similar to FIG. 7A, except depicting the connection device pivoted to the secured configuration.

The connection device 10 is movable with respect to the conduction system 6 between a secured configuration, as is depicted generally in FIGS. 1, 3, and 7B, and a variety of unsecured configurations, some of which are depicted generally in FIGS. 2, 4, and 7A. More specifically, in the secured configuration of the disconnect apparatus 4, the locking element 72 is received in the hole 98, and the key 76 is removed from the lock housing 70. Most typically, the key 76 that has been removed from the lock housing 70 will be stored on the network protector at a location thereon wherein the key 76 is inaccessible unless the network protector is in an OFF condition. That is, the key 76 is unavailable to a technician for use in unlocking the lock apparatus 22 unless the network protector is in the OFF condition whereby the disconnect apparatus 4 is electrically disconnected from the electrical supply lines that extend between a generation site and the network protector. Also in the secured configuration, and as is depicted generally in FIG. 3, the conductive element 84 is received in the receptacles 68A-D to complete a circuit that includes the first and second conductor assemblies 16 and 18. Further in the secured configuration, the pin 42 is received in the locking portion 96 of the slot 90, and the seal 86 is sealingly engaged with the main portion 24 to provide a fluid-tight connection between the support 12 and the connection device 10.

The lock apparatus 22 in its locked position is depicted generally in FIG. 6A. In such a position, the locking element 72 will be received in the hole 98 and the disconnect apparatus 4 will be in its secured configuration. In order to move the disconnect apparatus 4 away from the secured configuration, the key 76 is obtained by the technician, and the key 76 is received in a key slot formed in the lock housing 70. It is reiterated that the key 76 in the depicted exemplary embodiment cannot be obtained by the technician until the network protector has been placed in its OFF condition.

The key 76 can then be rotated with respect to the lock housing 70 to cause the locking element 72 to become retracted, as is depicted generally in FIG. 6B, which causes the locking element 72 to become retracted from the hole 98.

The technician can then grasp the handle 82 and pivot the connection device about its axis of elongation 88 to cause the pin 42 to move along the locking portion 96 of the slot 90 and to become received in the advancement portion 94 of the slot 90. The technician can then pull the connection device 10 along the axis of elongation 88 in a direction away from the conduction system 6 to cause the conductive element 84 to be removed from the receptacles 68A-D and to remove the connection device 10 from the opening 34.

During the course of such removal, and as is depicted generally in FIG. 4, the first conductor assembly 16 is electrically disconnected from the conductive element 84 prior to the nonconductive base 78 being removed from the opening 34. That is, the first conductor assembly 16 is situated on the support 12 in a position that will result in the first flexible conductors 52A and 52B being electrically disconnected from the conductive element 84 before the base 78 has cleared the opening 34. Advantageously, therefore, the conductive element 84 will be disconnected from the first conductor assembly 16 and thus from the electrical network prior to the conductive element 84 exiting the opening 34. This advantageously promotes the safety of the technician.

With the connection device 10 removed from the conduction system 6, the first and second conductor assemblies 16 and 18 are electrically isolated from one another. As such, the removal of the connection device 10 from the conduction system 6 electrically isolates the network protector from the electrical network. The technician's ability to remove and carry the connection device 10 in, say, a pocket, helps to reassure the technician that the network protector is isolated from the electrical network. Moreover, since the key 76 is unavailable to the technician unless the network protector is in its OFF condition, the technician can be assured that the network protector is electrically disconnected from the electrical network when the connection device 10 is removed from the conduction system 6. Further in this regard, the translucent window 28 permits the technician to look through the window 28 and into the interior region 30 to visually ascertain that the first and second conductor assemblies 16 and 18 are completely disconnected from one another.

As mentioned above, the key 76 can be removed from the key slot of the lock housing 70 only when the locking element 72 is in the locked position depicted generally in FIG. 6A. Moreover, the network protector in its OFF condition can only be returned to its ON position by removing the key 76 from the lock housing 70 and returning it to its location on the network protector. As such, the presence of the key 76 in the lock housing 70 avoids the network protector from being reenergized. Since the key 76 can only be removed from the lock housing 70 when the lock apparatus 22 is in its locked position (FIG. 6A), the key 76 can therefore be removed only in two possible situations. The first situation is when the connection device 10 is received on the conduction system 6 and the disconnect apparatus 4 to its secured configuration with the locking element 72 received in the hole 98. In the other, the situation is when the connection device 10 is removed from the opening 34, in which case the locking element 72 will be received in the opening 34 and prevent reinsertion of the connection device 10. The interlocking configuration of the key 76 thus enhances the safety of the technician in many fashions.

In order to return the disconnect apparatus 4 to its secured configuration, the conductive element 84 and a portion of the base 78 are received in the opening 34 by translating the connection device 10 longitudinally along the axis of elongation 88. The first and second flexible conductors 52A, 52B, 64A, and 64B are configured to be situated radially about the conductive element 84, and the conductive element 84 is translatable within the receptacles 68A-D. Moreover, due to circular shape of the first and second flexible conductors 52A, 52B, 64A, and 64B and their radial positioning with respect to the conductive element 84, the conductive element 84 can be generally said to be capable of rotation with respect to the first and second flexible conductors 52A, 52B, 64A, and 64B while being in electrical contact therewith. It is noted, however, that in the exemplary embodiment depicted herein, the conductive element 84 is disposed on the base 78, which has the slot 90 formed therein. That is, the pin 42 received in the advancement portion 94 of the slot 90 mechanically restricts the ability of the conductive element 84 to be rotated with respect to the first flexible conductors 52A and 52B. It is understood, however, that in the absence of such mechanical restriction, the conductive element 84 would be freely rotatable with respect to the first and second flexible conductors 52A, 52B, 64A, and 64B while being electrically connected therewith.

The pin 42 is received in the advancement portion 94 of the slot 90. The connection device 10 can then be translated along the axis of elongation 88 a distance sufficient to cause the conductive element 84 to be received in the receptacles 68A-D and thus to be electrically connected with the first and second flexible conductors 52A, 52B, 64A, and 64B. Once the pin 42 has been advanced along the advancement portion 94 sufficiently that it is aligned with the locking portion 96 of the slot 90, the connection device 10 is rotated about its axis of elongation 88 to cause the pin 42 to be translated along the locking portion 96 of the slot 90.

During the aforementioned longitudinal movement of the connection device 10 with respect to the support 12, the handle 82 will be oriented at an angle that is oblique to the indicator 40, as is depicted generally in FIG. 7A. That is, the handle 82 can be said to be disposed generally in a plane that is oriented vertically in FIG. 7A, and the vertical direction in FIG. 7A and the indicator 40 in FIG. 7A are oriented oblique to one another. Once the connection device 10 has been translated along the axis of elongation 88 sufficiently that the pin 42 is aligned with the locking portion 96 of the slot 90, the seal 86 has advanced sufficiently toward the support 12 that it has become engaged with the support 12 and is sealingly disposed against it. The connection device 10 can then be rotated from the position depicted generally in FIG. 7A to the position depicted generally in FIG. 7B wherein the handle 82 becomes aligned with the indicator 40, which aligns the hole 98 with the locking element 72. The key 76 can then be rotated with respect to the lock housing 70 to cause the locking element 72 to be received in the hole 98.

In performing the rotation of the connection device 10 between the position depicted generally in FIG. 7A and the position depicted generally in FIG. 7B, it is understood that the locking portion 96 of the slot 90 operates as another longitudinal engagement element that is cooperable with the pin 42 which, as set forth above, is itself a longitudinal engagement element. The pin 42 and the locking portion 96 thus serve as cooperable longitudinal engagement elements which are engaged with one another when the connection device 10 has been translated along the axis of elongation 88 sufficiently to permit the pin 42 to be received in the locking portion 96 of the slot 90, which is the condition in FIG. 7A. In such longitudinal position, the locking element 72 can be received in the hole 98 upon rotation of the connection device 10 to the rotational position depicted generally in FIG. 7B. That is, the connection device 10 is first received in the opening 34 a sufficient longitudinal distance that that the locking element 72 and the hole 98 become longitudinally aligned with one another. In such a position, the pin 42 and the locking portion 96 are aligned with one another. The first and second longitudinal engagements elements that are provided by the pin 42 and the locking portion 96 are then engaged with one another upon a rotation of the connection device 10 about the axis of elongation 88. The connection device 10 is rotated sufficiently to cause the hole 98 to become rotationally aligned with the locking element 72, and the locking element 72 is received in the hole 98 by a rotation of the key 76.

The key 76 can then be removed from the lock housing 70 and returned to the network protector. The network protector can then be switched to its ON condition.

Advantageously, therefore, the disconnect apparatus 4 is configured to enable a network protector to be electrically isolated from an electrical network, which promotes safety when maintenance or repair operations are performed on a network protector. Moreover, the seal 86 permits the disconnect apparatus 4 to be employed in a submerged condition.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. An electrical disconnect apparatus comprising:
a support;
a first electrical conductor situated on the support;
a second electrical conductor situated on the support; and
a connection device comprising a conductive element, the connection device being structured to be movable between:
a first position wherein the conductive element is electrically connected with each of the first and second electrical conductors and completes at least a portion of a circuit that includes the first and second electrical conductors, and
a second position wherein the conductive element is removed from electrical contact with each of the first and second electrical conductors; and
wherein the first electrical conductor has a first receptacle formed therein, and wherein the second electrical conductor has a second receptacle formed therein, the conductive element being electrically conductively received in the first and second receptacles in the first position of the connection device.

2. The electrical disconnect apparatus of claim 1 wherein the first and second receptacles are aligned with one another, and wherein the conductive element includes an elongated portion and is structured to be translated along its direction of elongation between the first and second positions.

3. The electrical disconnect apparatus of claim 2 wherein the support has an interior region, the first and second receptacles being situated within the interior region, and wherein the support has an opening formed therein that is aligned with the first and second receptacles.

4. The electrical disconnect apparatus of claim 3 wherein at least one of the connection device and the support comprises a seal element which, in the first position of the connection device, sealingly extends between the support and the connection device in the vicinity of the opening.

5. The electrical disconnect apparatus of claim 3 wherein the support has a portion that is at least partially translucent and that allows visual access to at least a portion of the interior region.

6. The electrical disconnect apparatus of claim 3 wherein the connection device further comprises a base and a handle formed of an electrically insulative material, the handle and the conductive element being disposed on the base at opposite ends thereof.

7. The electrical disconnect apparatus of claim 3 wherein the conductive element additionally is rotatable about its direction of elongation with respect to at least one of the first and second electrical conductors while being electrically connected therewith.

8. The electrical disconnect apparatus of claim 7 wherein the first and second electrical conductors are situated radially about at least a portion of the conductive element in the first position.

9. The electrical disconnect apparatus of claim 2 wherein one of the support and the connection device comprises a lock apparatus that includes a movable locking element, the lock apparatus being structured to be movable between a locked position wherein the locking element extends between the support and the connection device and an unlocked position wherein the locking element is retracted.

10. The electrical disconnect apparatus of claim 9 wherein the other of the support and the connection device has a hole formed therein, at least a portion of the locking element being received in the hole in the locked position, and wherein at least one of the support and the connection device comprises an indicator that is structured to provide an indication representative of the hole being positioned to receive therein at least a portion of the locking element.

11. The electrical disconnect apparatus of claim 10 wherein the connection device is rotatable with respect to the first and second electrical conductors about an axis that extends along the direction of elongation, and wherein the indicator is structured to provide an indication representative of the connection device being in a lockable position wherein the connection device is rotationally situated to permit the hole to receive therein at least a portion of the locking element.

12. The electrical disconnect apparatus of claim 11 wherein one of the support and the connection device further comprises a first longitudinal engagement element, and wherein the other of the support and the connection device comprises a second longitudinal engagement element, the first and second longitudinal engagement elements being engaged with one another when the connection device is situated in a longitudinal position with respect to the first and second electrical conductors that permits the connection device to be rotatable to the lockable position.

13. The electrical disconnect apparatus of claim 12 wherein the base comprises a shank that is receivable in the opening and that is of a longitudinal dimension sufficiently great that at least a portion thereof is disposed in the opening when the connection device in an intermediate position between the first and second positions wherein the conductive element is removed from electrical contact with one of the first and second electrical conductors.

14. The electrical disconnect apparatus of claim 1 wherein the connection device in the second position can be physically removed from the support.

* * * * *